United States Patent
Liu et al.

(10) Patent No.: US 11,056,408 B2
(45) Date of Patent: Jul. 6, 2021

(54) POWER SEMICONDUCTOR DEVICE WITH ACTIVE SHORT CIRCUIT FAILURE MODE

(71) Applicant: ABB Power Grids Switzerland AG, Baden (CH)

(72) Inventors: Chunlei Liu, Oberrohrdorf (CH); Franc Dugal, Benglen (CH); Munaf Rahimo, Gänsbrunnen (CH); Peter Karl Steimer, Ehrendingen (CH)

(73) Assignee: ABB Power Grids Switzerland AG, Baden (CH)

( * ) Notice: Subject to any disclaimer, the term of this patent is extended or adjusted under 35 U.S.C. 154(b) by 0 days.

(21) Appl. No.: 16/528,791

(22) Filed: Aug. 1, 2019

(65) Prior Publication Data

US 2019/0355633 A1 Nov. 21, 2019

Related U.S. Application Data

(63) Continuation of application No. PCT/EP2018/052434, filed on Jan. 31, 2018.

(30) Foreign Application Priority Data

Feb. 1, 2017 (EP) ..................................... 17154196

(51) Int. Cl.
*H01L 23/051* (2006.01)
*H01L 23/62* (2006.01)
(Continued)

(52) U.S. Cl.
CPC .......... *H01L 23/051* (2013.01); *H01L 23/492* (2013.01); *H01L 23/62* (2013.01);
(Continued)

(58) Field of Classification Search
CPC ..... H01L 23/051; H01L 23/492; H01L 23/62; H01L 25/072
(Continued)

(56) References Cited

U.S. PATENT DOCUMENTS 6,426,561 B1 7/2002 Lang et al.
2004/0227231 A1* 11/2004 Maly ..................... H01L 25/072
257/724

(Continued)

FOREIGN PATENT DOCUMENTS

EP 2503595 A1 9/2012
EP 2530711 A1 12/2012
(Continued)

OTHER PUBLICATIONS

European Patent Office, International Search Report & Written Opinion issued in corresponding Application No. PCT/EP2018/052434, dated May 14, 2018, 12 pp.

*Primary Examiner* — Sheikh Maruf
(74) *Attorney, Agent, or Firm* — Slater Matsil, LLP

(57) ABSTRACT

A power semiconductor device includes a Si chip providing a Si switch and a wide bandgap material chip providing a wide bandgap material switch, wherein the Si switch and the wide bandgap material switch are electrically connected in parallel. A method for controlling a power semiconductor device includes: during a normal operation mode, controlling at least the wide bandgap material switch for switching a current through the power semiconductor device by applying corresponding gate signals to at least the wide bandgap material switch; sensing a failure in the power semiconductor device; and, in the case of a sensed failure, controlling the Si switch by applying a gate signal, such that a current is generated in the Si chip heating the Si chip to a temperature forming a permanent conducting path through the Si chip.

20 Claims, 4 Drawing Sheets

(51) Int. Cl.
   *H01L 23/492* (2006.01)
   *H01L 25/07* (2006.01)
   *H02H 3/02* (2006.01)
   *H01L 25/18* (2006.01)
(52) U.S. Cl.
   CPC .......... *H01L 25/072* (2013.01); *H02H 3/023* (2013.01); *H01L 25/18* (2013.01)
(58) Field of Classification Search
   USPC .......................................... 438/117; 257/688
   See application file for complete search history.

(56) References Cited

U.S. PATENT DOCUMENTS

| | | | | |
|---|---|---|---|---|
| 2007/0215999 | A1* | 9/2007 | Kashimoto | H01L 24/97 257/678 |
| 2009/0026967 | A1* | 1/2009 | Mazumder | H01L 31/1126 315/159 |
| 2009/0309524 | A1* | 12/2009 | Rider | H02M 5/458 318/400.2 |
| 2012/0262218 | A1 | 10/2012 | Klaka et al. | |
| 2013/0015496 | A1* | 1/2013 | Konno | H01L 25/072 257/140 |
| 2013/0105961 | A1* | 5/2013 | Jones | H01L 23/24 257/691 |
| 2013/0248883 | A1* | 9/2013 | Das | H01L 29/2003 |
| 2014/0198475 | A1* | 7/2014 | Menzies | H05K 5/0091 361/811 |
| 2014/0225245 | A1* | 8/2014 | Dugal | H01L 25/072 257/688 |
| 2015/0137871 | A1* | 5/2015 | Takano | H03K 17/063 327/389 |
| 2016/0351505 | A1* | 12/2016 | Tamada | H01L 23/645 |
| 2017/0301614 | A1* | 10/2017 | Kimura | H01L 23/49575 |
| 2017/0338190 | A1* | 11/2017 | Fujino | H01L 23/3735 |
| 2018/0206359 | A1* | 7/2018 | McPherson | H02M 3/158 |
| 2018/0247888 | A1* | 8/2018 | Oya | H01L 23/053 |
| 2018/0342440 | A1* | 11/2018 | Nishiyama | H01L 25/115 |
| 2019/0131210 | A1* | 5/2019 | Hino | H01L 24/29 |
| 2019/0333838 | A1* | 10/2019 | Nawaz | H01L 23/373 |
| 2019/0355634 | A1* | 11/2019 | Liu | H01L 23/051 |

FOREIGN PATENT DOCUMENTS

| | | | |
|---|---|---|---|
| EP | 2824701 A1 | 1/2015 | |
| EP | 2839573 B1 | 1/2016 | |
| WO | 2012107482 A2 | 8/2012 | |
| WO | 2013004297 A1 | 1/2013 | |
| WO | WO-2013004297 A1 * | 1/2013 | .......... H01L 23/051 |
| WO | 2013156078 A1 | 10/2013 | |
| WO | 2016062426 A1 | 4/2016 | |

* cited by examiner

POWER SEMICONDUCTOR DEVICE WITH ACTIVE SHORT CIRCUIT FAILURE MODE

FIELD OF THE INVENTION

The invention relates to the field of power semiconductor devices. In particular, the invention relates to a method for controlling a power semiconductor device and to the semiconductor device.

BACKGROUND OF THE INVENTION

Power semiconductor devices such as converters, electrical drives, STATCOMS, etc. are usually assembled of a plurality of power semiconductor modules, each of which mechanically and electrically connects one or more power semiconductor elements. In high voltage DC applications, a series connection of multiple power semiconductor modules is usually required to fulfil high voltage and high current requirements. A power semiconductor module that in case of a failure becomes permanently conducting may have great advantages in such series connections.

Such a short circuit failure mode (SCFM) may be reached in several ways. In passive SCFM concepts, the converter current flowing through a failed Si (silicon) chip may create a low-ohmic resistance in case of a failure of the Si chip. For example, the current may heat the Si chip and an Al (aluminium) preform on the chip. The eutectic reaction between Si and Al at a relative low temperature (577° C.) may then create a permanent conducting current path as intrinsic failure compensation.

For example, EP 2 503 595 A1 relates to a power semiconductor module with a semiconductor chip based on Si, which is provided between two layers that are capable of forming an eutectic alloy with the Si material of the chip.

Furthermore, there are active SCFM concepts, such as EP 2 824 701 A1, which relates to a high power semiconductor module with a short circuit device adapted to bypass a semiconductor module.

In general, semiconductor devices with intrinsic SCFM ability allow a series connection of semiconductor devices with redundancy and may omit a mechanical cell bypass.

Due to their high blocking capabilities, semiconductor modules with semiconductor devices based on SiC (silicon carbide) and other wide bandgap materials are more and more employed in high voltage applications.

WO 2016/062426 A1 relates to a semiconductor module with an IGBT and a SiC switch on one substrate, wherein a pin is pressed on the IGBT in a press-pack arrangement.

WO 2013/004297 A1 shows IGBTs, which are connected in parallel. In the case of a failure, a high-voltage gate pulse is applied to at least one of the IGBTS.

DESCRIPTION OF THE INVENTION

It is an objective of the invention to provide compact, secure and less complex power semiconductor devices based on wide bandgap semiconductor elements.

This objective is achieved by the subject-matter of the independent claims. Further exemplary embodiments are evident from the dependent claims and the following description.

A first aspect of the invention relates to a method for controlling a power semiconductor device. Here and in the following, the term "power" may relate to the ability to process currents of more than 10 A and/or more than 1.000 V. The method may be performed by a gate controller of the power semiconductor device.

According to an embodiment of the invention, the power semiconductor device comprises a Si (silicon) chip providing a Si switch and comprises a wide bandgap material chip providing a wide bandgap material switch, wherein the Si switch and the wide bandgap material switch are electrically connected in parallel. A semiconductor switch in general may be a device that is adapted for switching a current through the switch by the control of a gate. A wide bandgap material may be SiC, GaN, etc., i.e. a semiconductor material that has a bandgap at least twice as much as Si.

The Si switch and the wide bandgap material switch, which are connected in parallel, may be provided in the same semiconductor module and/or may be provided in different semiconductor modules.

A power semiconductor device as described in the above and in the below and controlled as described below may be stacked and/or series-connected with other equally designed and/or equally controlled power semiconductor devices for switching high voltages.

According to an embodiment of the invention, the method comprises: during a normal operation mode, controlling at least the wide bandgap material switch for switching a current through the power semiconductor device by applying corresponding gate signals to at least the wide bandgap material switch; sensing a failure in the power semiconductor device; and, in the case of a sensed failure, controlling the Si switch by applying a gate signal, such that a current is generated in the Si chip, which heats the Si chip to a temperature forming a permanent conducting path through the Si chip, for example by forming an eutectic alloy from the Si material of the Si chip and a metal preform arranged in contact with the Si chip.

In other words, a Si chip connected in parallel with a wide bandgap material chip may be used for providing a short circuit failure mode (SCFM) for both the Si chip and the wide bandgap material chip. The Si chip is arranged in the power semiconductor device, such that it is capable of providing a SCFM for the power semiconductor device and/or that it is adapted for forming a conducting path, when an overcurrent is applied to it. The Si chip may form a conducting path with a low-ohmic resistance in case of a semiconductor (overvoltage, safe operating area, surge current and/or thermal) breakdown or a related gate control breakdown. In the case a failure is detected, a gate signal is applied to the Si switch of the Si chip, such that the Si chip is actively transferred into its SCFM.

Furthermore, in the case of a sensed failure, the gate signal applied to the Si switch has a lower voltage than in the normal operation mode, such that an internal resistance of the Si chip is higher than in the normal operation mode. A possibility of actively transferring the Si chip into its SCFM is to switch its switch into a resistive conducing state with a resistance higher as in its normal conducting mode and lower than its normal blocking mode. In this case, a load current through the Si chip, which is generated, when normally operating a stack and/or series connection of equivalently designed power semiconductor devices, may be used for heating the Si chip until the permanently conducting path is formed. The SCFM capable arrangement of a Si chip and, for example, a metal preform on the Si chip, is then driven into a thermal overload by an externally applied current, which finally forms the SCFM.

According to an embodiment of the invention, a gate signal for the Si switch and a gate signal for the wide bandgap material switch are generatable independently from each other, such that after sensing the failure, only the Si switch is provided with a gate signal. For example, the control arrangement may have a gate controller for the wide bandgap material switch and a separate gate controller for the Si switch. However, it also may be that independent gate signals are generated by the same controller. Independent gate signals may be signals that have a different voltage level at the same time point.

According to an embodiment of the invention, during the normal operation mode, the Si switch is controlled to be switched accordingly to the wide bandgap material switch. It may be that the Si chip is also used for switching the load current. During the normal operation mode, the gate signals may have a substantially equal form.

However, it also may be that the Si switch is only used for providing the SCFM for the power semiconductor device. In this case, the Si switch may be in blocking mode during a normal operation mode of the power semiconductor device and/or may be switched into a resistive conducting state in the case of the detection of a failure in the power semiconductor device.

According to an embodiment of the invention, the failure is sensed by measuring a voltage across the power semiconductor device, which voltage in the case of a failure is higher than a nominal voltage, when the power semiconductor module is switched into a conducting state. Such a voltage may be measured with a voltage sensor integrated into the power semiconductor device. In the case, the SiC chip fails, its resistance may stay higher as a nominal resistance, when it is switched into a conducting state. The resulting voltage drop may be used as indicator for a failure.

According to an embodiment of the invention, the failure is sensed by light detection inside a power semiconductor module accommodating the wide bandgap material chip. Some kind of failures may generate an arc, which may be detected with a light detection sensor.

According to an embodiment of the invention, the failure is sensed by arc voltage detection inside a power semiconductor module accommodating the wide bandgap material chip. A further possibility is that the arc is detected by arc voltage measurements.

In any case, a measurement signal from the corresponding sensor (such as a module voltage sensor, a light detection sensor and/or an arc voltage sensor) may be evaluated by the controller, which generates a failure signal and uses this failure signal for triggering the Si chip into its SCFM.

According to an embodiment of the invention, the Si chip is attached to a metal preform adapted for forming a conducting path through the Si chip, when heated above a specific temperature (i.e. a conducting path forming temperature) by a current through the Si chip. The Si chip and the metal preform may be adapted for forming an eutectic alloy, when heated. For example, the metal preform, which may be a metal body directly attached to the Si chip, may be made of Al (aluminium) or Mo (molybdenum).

According to an embodiment of the invention, the power semiconductor device is adapted for forming an at least temporary conducting path through the wide bandgap material chip, when heated by an overcurrent. It may be possible that also the wide bandgap material chip has an at least temporary short circuit failure mode. For example, in the case of a failure, a temporary conducting path and/or a conducting path with a resistance higher than the conducting state of the wide bandgap material switch may be formed. The SCFM of the wide bandgap material chip may not achieve a stable low-ohmic resistance in case of a semiconductor (overvoltage, SOA, surge current, thermal) or related gate drive breakdown and/or may be supported by the SCFM provided by the Si chip.

According to an embodiment of the invention, the wide bandgap material chip is attached to a metal preform adapted for forming the conducting path. Analogously, to the Si chip, the wide bandgap material chip may be in direct contact with a metal preform that forms a conducting material with the wide band material, when heated. For example, the metal preform, which may be a metal body directly attached to the wide bandgap material chip, may be made of Mo (molybdenum).

According to an embodiment of the invention, the Si switch is a thyristor (such as a PCT or IGCT), a transistor (such as an IGBT) or a bi-mode type switch with an internal reverse conducting diode. For example, in a reverse conducting IGBT (RC-IGBT) such as a BIGT (a Bi-Mode Insulated Gate Transistor), an IGBT and a reverse conducting diode are combined in one Si substrate. A reverse conducting internal diode may have the advantage that no separate free-wheeling diode is needed.

According to an embodiment of the invention, the wide bandgap material is SiC and/or the wide bandgap material switch is a transistor. For example, the wide bandgap material switch may be a SiC MOSFET, which also may have an internal reverse conducting diode.

A further aspect of the invention relates to a controller adapted for performing the method as described in the above and in the following. For example, the controller may be a gate controller for the Si switch and the wide bandgap material switch. The controller may comprise a processor, which, when a computer program is executed on it, performs the method. I.e. the method may be implemented at least partially in software.

A further aspect of the invention relates to a power semiconductor device. A power semiconductor device may comprise one or more power semiconductor modules, which accommodate the Si chip and the wide bandgap material chip as well as their electrical connections. Furthermore, the power semiconductor device may comprise a controller as mentioned above.

It has to be understood that features of the method as described in the above and in the following may be features of the semiconductor device as described in the above and in the following, and vice versa.

According to an embodiment of the invention, the semiconductor device comprises: at least one power semiconductor module for accommodating a Si chip with a Si switch and a wide bandgap material chip with a wide bandgap material switch; a gate controller for providing gate signals to the Si switch and the wide bandgap material switch; and a measurement unit for sensing a failure in the power semiconductor device. The measurement unit may comprise a module voltage sensor, an arc voltage sensor and/or a light detection sensor, for example, as described above. The controller may evaluate measurements from the measurement unit for detecting a failure. In the case of a detected failure, the controller may actively turn-on the SCFM capable Si chip.

According to an embodiment of the invention, the gate controller is adapted for generating a common gate signal for the Si switch and the wide bandgap material switch. For example, a gate of the Si switch and a gate of the wide bandgap material switch may be electrically interconnected with each other in the power semiconductor device. Thus, in the case of a failure, the gate signal for switching the Si switch into the SCFM also may be applied to the wide bandgap material switch.

According to an embodiment of the invention, the controller is adapted for generating separate gate signals for the Si switch and the wide bandgap material switch. For example, a gate of the Si switch and a gate of the wide bandgap material switch are galvanically separated from each other in the power semiconductor device. For example, the power semiconductor device may provide different terminals for the gates of its switches.

The Si chip and the wide bandgap material chip may be provided by the same or by different semiconductor modules. A power semiconductor module in general may be a device mechanically supporting and providing terminals for one or more power semiconductor elements such as transistors, thyristors, diodes, etc. In general, a power semiconductor module may comprise a housing providing the terminals, in which the one or more power semiconductor elements are accommodated.

According to an embodiment of the invention, the Si chip is provided in a first semiconductor module with a first housing and the wide bandgap material chip is provided in a second semiconductor module in a second housing. For example, the power semiconductor device may be made by electrically interconnecting two semiconductor modules that may be made of standard components.

According to an embodiment of the invention, the Si chip and the wide bandgap material chip are provided by one semiconductor module and/or within the same housing. It also may be possible that both chips are provided within the same housing.

According to an embodiment of the invention, the Si chip and/or the wide bandgap material chip are accommodated in a hermetically sealed housing. In such a way, oxygen may not reach the position, where the conducting path is formed, which may have the advantage that the conducting path is formed more reliable. It also may be that specific reactions for forming the conducting path only may take place without oxygen.

According to an embodiment of the invention, the Si chip and/or the wide bandgap material chip are accommodated in an explosion box. The housing of the Si chip and/or the wide bandgap material chip may be adapted for protecting the environment from exploding components.

In any case, i.e. whether the Si chip is arranged in a different or on the same housing and/or semiconductor module, the Si chip may be in a press-pin arrangement, in which, for example, a press pin presses a metal preform against the Si chip. However, it also may be possible that the Si chip is provided in a wire-bonded arrangement. As in the case of the Si chip, the wide bandgap material chip may be in a press-pin arrangement, in which, for example, a press pin presses a metal preform against the wide bandgap material chip. However, it also may be possible that the wide bandgap material chip is provided in a wire-bonded arrangement.

According to an embodiment of the invention, the Si chip and the wide bandgap material chip are attached to one baseplate, for example by sintering, soldering or welding. In this case, the Si chip may be in a press-pack arrangement, i.e. with a press-pin pressing a metal preform against the Si chip. The wide bandgap material chip may be electrically connected in parallel with the Si chip on the side of the press-pin with wire-bonds and/or with a metal clip.

It may be possible that more than one wide bandgap material chip are provided with a SCFM of one Si chip. All the wide bandgap material chips may be connected in parallel with this Si chip.

According to an embodiment of the invention, the power semiconductor device comprises one Si chip and at least one wide bandgap material chip attached to one baseplate; wherein on a side opposite to the baseplate, the Si chip and the at least one wide bandgap material chip are electrically interconnected with a clip; wherein a metal preform for forming a conducting path through the Si chip is sandwiched between the clip and the Si chip; and wherein a press pin is arranged above the clip, pressing on the clip and the metal preform. Such an arrangement of one Si chip and one or more wide bandgap material chips may be very compact and may provide a reliable SCFM, which may be actively activated with a common gate controller or two separate gate controllers as mentioned above.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
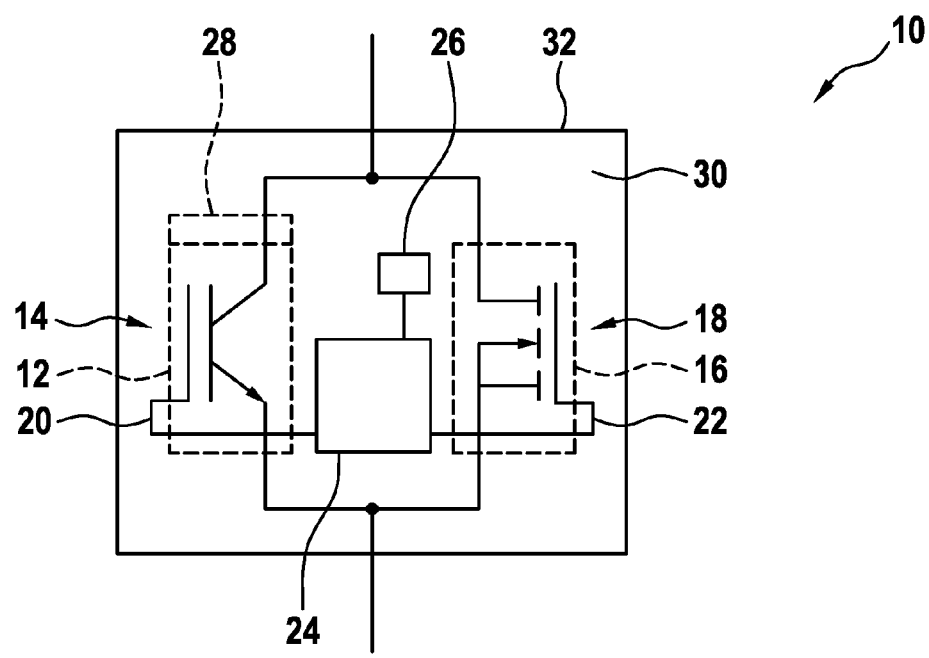
FIG. 1 schematically shows a power semiconductor device according to an embodiment of the invention.

FIG. 1 shows a power semiconductor device 10 with a Si chip 12, in which a Si switch 14 is provided, and a wide bandgap material chip 16, in which a wide bandgap material switch 18 is provided. Both switches 14, 18 are connected in parallel.

As shown in FIG. 1, the Si switch 14 may be an IGBT. In general, the Si switch 14 may be any type of Si switch, such as an IGCT, RC-IGBT such as a BIGT (i.e. a bi-mode IGBT with reverse conducting diode in the Si chip 12), etc.

The wide bandgap material of the wide bandgap material chip 16 may be SiC or any kind of other wide bandgap material, such as GaN, AN, etc. In FIG. 1, it is shown that the wide bandgap material switch 18 may be a MOSFET. In general, the switch 18 may be any kind of wide bandgap material switch.

Both switches 14, 18 have a gate 20, 22 that is provided from a gate controller 24 with a gate signal for switching the switches 14, 18.

Furthermore, the power semiconductor device comprises a measurement unit 26, which is adapted for detecting a failure in the power semiconductor device 10. For example, the failure may be detected with a voltage sensor by an abnormal voltage across the power semiconductor device 10 and/or the switch 14. It also may be possible that the failure is detected with an arc voltage sensor and/or a light sensor, which detects the light of an arc.

As described below, the gate controller 24 may receive a signal indicating an error from the measurement unit 26 and may trigger the Si chip 12 into a permanent conducting state, in which a permanent conducting path through the Si chip 12 is formed.

For example, such a SCFM (short-circuit failure mode) may be formed with a metal preform 28 or metal body 28 in direct contact with the Si chip 12, which at a specific temperature forms an eutectic alloy with the Si chip 12. For example, the metal preform 28 may be made of Al. However, also other mechanisms, such as forming a non-eutectic alloy or melting a path through the Si chip 12, may be used for providing a SCFM with the Si chip 12. It has to be noted that the Si chip 12 and/or the Si switch is at least partially destroyed, when triggered into the SCFM.

For example, the gate controller 24 may provide the Si switch 14 with a gate signal, such that the Si switch becomes conducting with a resistance higher than in a completely conducting state that is used for switching a load current through the power semiconductor device 10. A load current through the Si chip 12 then may heat the Si chip 12 to the temperature, at which a permanently conducting path is formed, for example by the formation of an eutectic alloy.

As described above and below, also the wide bandgap material chip 16 may be in an arrangement adapted for forming an at least temporary conducting path in the case of a failure. This at least temporary conducting path may be formed by at least partially destroying the wide bandgap material chip 16. However, the mechanism forming this conducting path may not be so reliable as the one of the Si chip 12 and/or the conducting path in the wide bandgap material chip 16 may degrade faster than the one in the Si chip 12.

In FIG. 1, the chips 12 and 16 are provided in the same semiconductor module 30 within the same housing 32, in which also the gate controller 24 and the measurement unit 26 are accommodated. For example, the chips 12, 16 may be bonded to the same baseplate or substrate for forming the semiconductor module 30. The housing 32 may be a hermetic or non-hermetic housing 32.

For example, the housing 32 may be a hermetic sealed ceramics housing, in which the chips 12 and 16 and a common substrate are assembled. It also may be possible that the chips 12, 16 are cast into a plastics material for forming the housing 32.

In a hermetic housing 32, such as provided by a hermetically sealed ceramics housing, the metal preform 28 on the Si chip 12 may be made of Mo or the Si chip 12 may be sandwiched between two Mo metal preforms. In this case, when the Si melts, it may form a conductive $MoSi_2$ with a resistance of less than 0.1 mOhm typically, which may provide the conducting path. As there is no oxygen in a hermetic housing, no $SiO_2$ can be formed, which would be an insulator.

The process of forming the eutectic alloy from Al and Si also may take place in the presence of oxygen and in this case, the housing 32 needs not be hermetic.

Furthermore, the Si chip 12 may be in a press-pack arrangement, i.e. that the metal preform 28 is pressed with a press pin 42 against the Si chip 12. Also, the wide bandgap material chip 16 may be in such a press-pack arrangement with or without a metal preform.

Alternatively, it may be possible that the Si chip 12 and/or the wide bandgap material chip 16 are in a bond wire or a clip arrangement, in which a main electrode (usually source or emitter) of the switch 14, 18 is connected via wire bonds or a clip with the terminals of the semiconductor module 30. The gates 20, 22 usually are connected with wire bonds to further conductors in the semiconductor module 30.

It may be possible that the Si chip 12 is in a press-pack arrangement, while the wide bandgap material chip 16 is in a wire bond or clip arrangement and vice versa.

Figure 2:
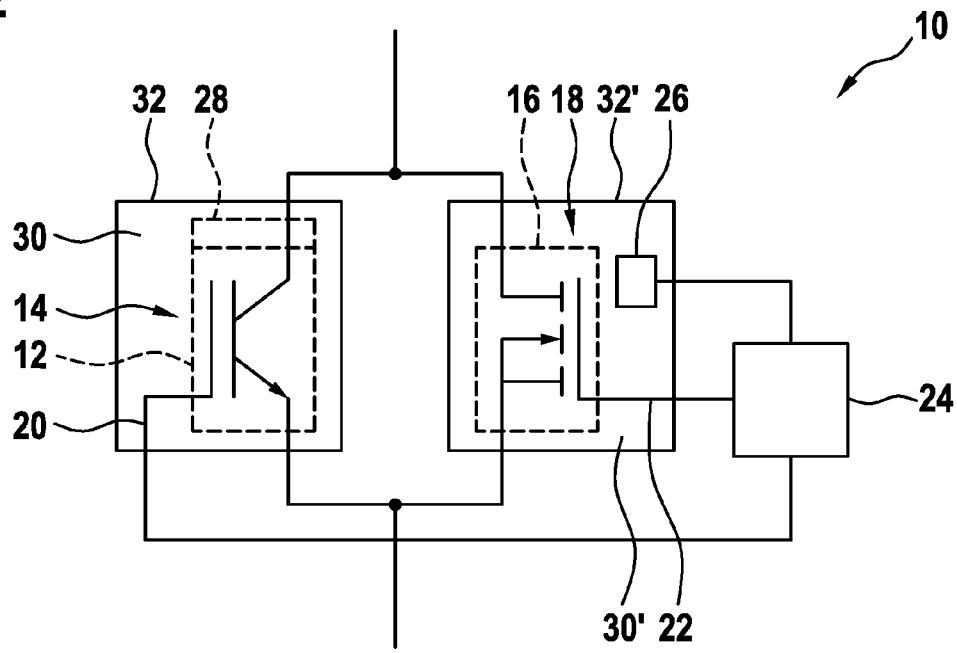
FIG. 2 schematically shows a power semiconductor device according to a further embodiment of the invention.
Figure 3:
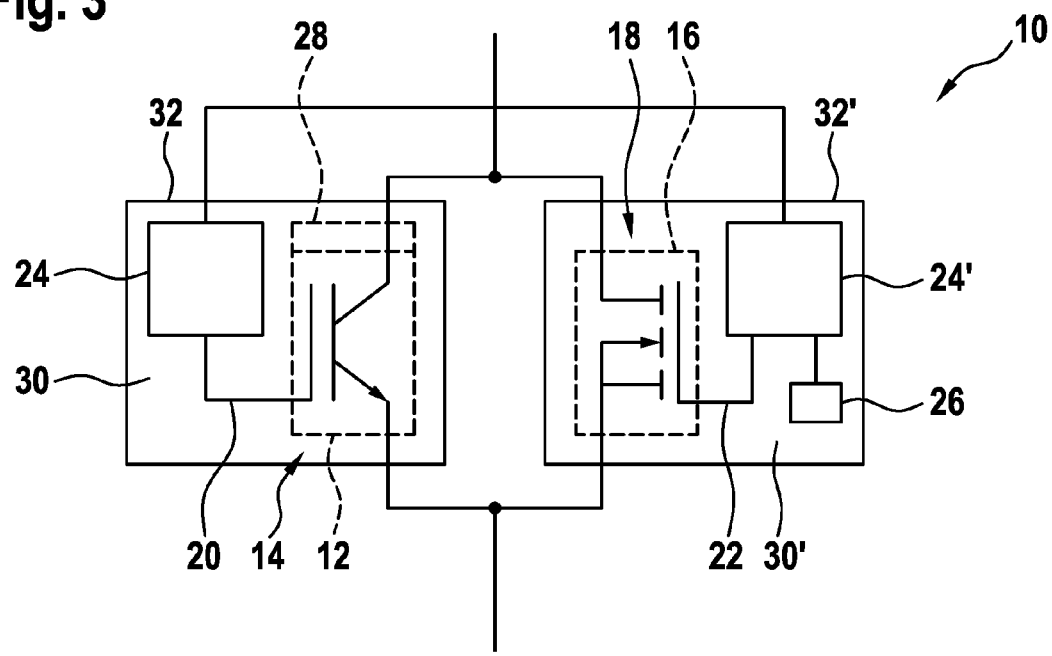
FIG. 3 schematically shows a power semiconductor device according to a further embodiment of the invention.

In FIGS. 2 and 3, the Si chip 12 is provided by a first semiconductor module 30 in a first housing 32 and the wide bandgap material chip 16 is provided in a second semiconductor module 32', which may have a housing 32' of its own.

Again, one or both of the housings 32, 32' may be a hermetic or non-hermetic housing 32', for example hermetic sealed ceramics housings 32, 32'. It also may be possible that one or both of the semiconductor modules 30, 30' are cast into a plastics material for forming the housing 32. It also may be that either the Si chip 12 or the wide bandgap material chip 16 or both chips 12, 16 are in a press-pack arrangement or a wire bond or clip arrangement.

A special embodiment may be that the Si switch 14 is a Si IGBT or a RC-IGBT or a BIGT, which is in a press-pin arrangement, while the switch 18 is composed of one or more SiC MOSFETs in a wire-bonded arrangement. The Si chip 12 may be in a ceramic press-pack housing 32. The one or more SiC MOSFETs may be in an explosion proof housing 32'.

Furthermore, as shown in FIG. 2, both switches 14, 18 may be interconnected with their gates 20, 22, which may be connected to the same gate controller 24, which may be arranged outside of the modules 30, 30' and/or the housings 32, 32'. However, it also may be possible that the gate controller 24 is arranged in one of the modules 30, 30' and/or one of the housings 32, 32'.

With respect to FIG. 3, each of the switches 14, 18 may be controlled by a different gate controller 24, 24'. These gate controllers 24, 24' may be arranged in the corresponding module 30, 30' and/or housing 32, 32'. The gate controller 24 of the Si switch 14 may be communicatively interconnected with the gate controller 24' of the wide bandgap switch 18, such that the gate controller 24 may send a failure signal to the gate controller 24', which then triggers the Si chip 12 into the SCFM.

It has to be noted that also the embodiment shown in FIG. 1 may have two separate gate controllers 24, 24' as described with respect to FIG. 3.

Figure 4:
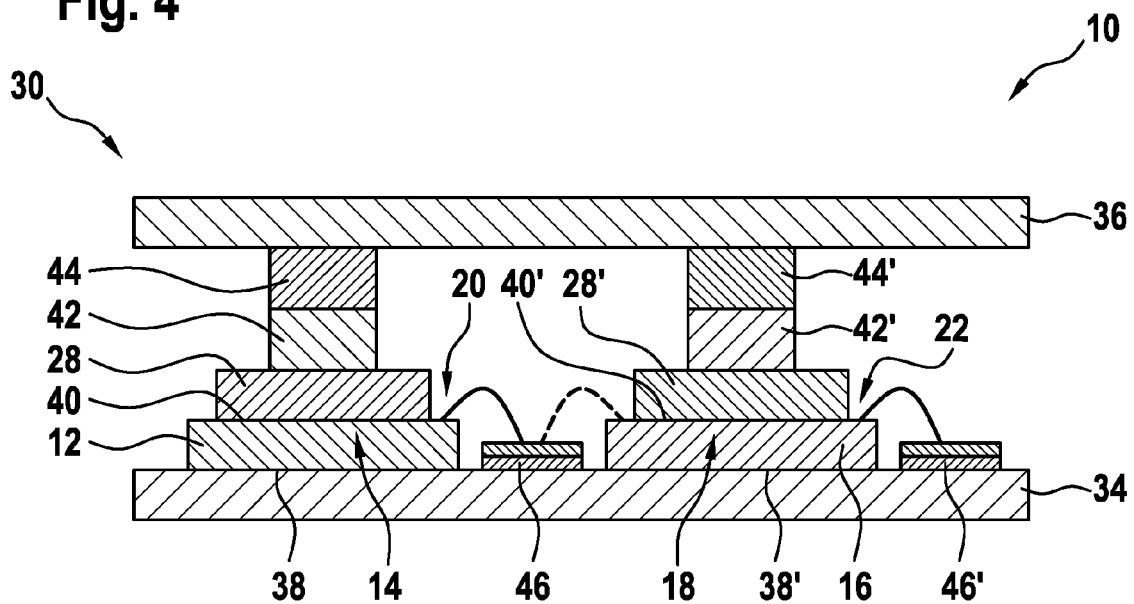
FIG. 4 schematically shows a cross-section of a power semiconductor device according to a further embodiment of the invention.
Figure 5:
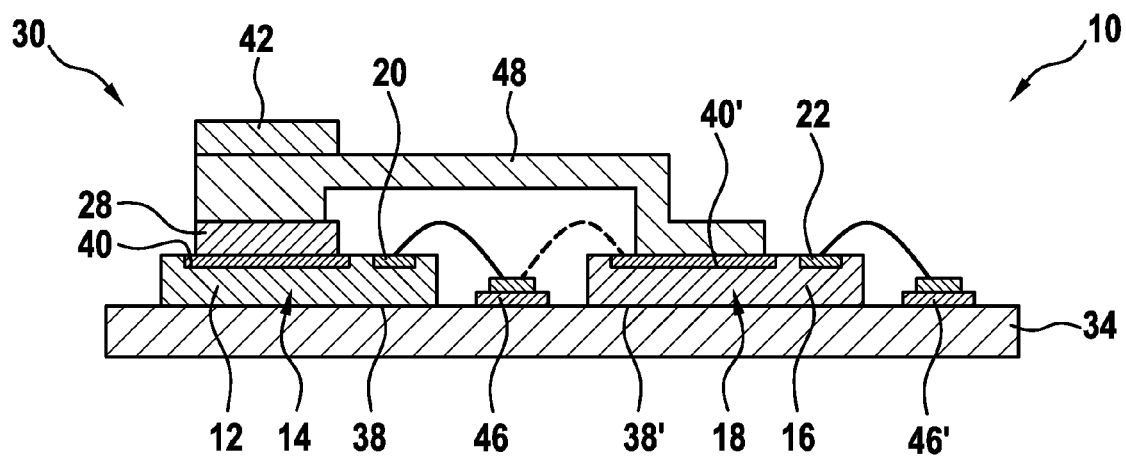
FIG. 5 schematically shows a cross-section of a power semiconductor device according to a further embodiment of the invention.
Figure 6:
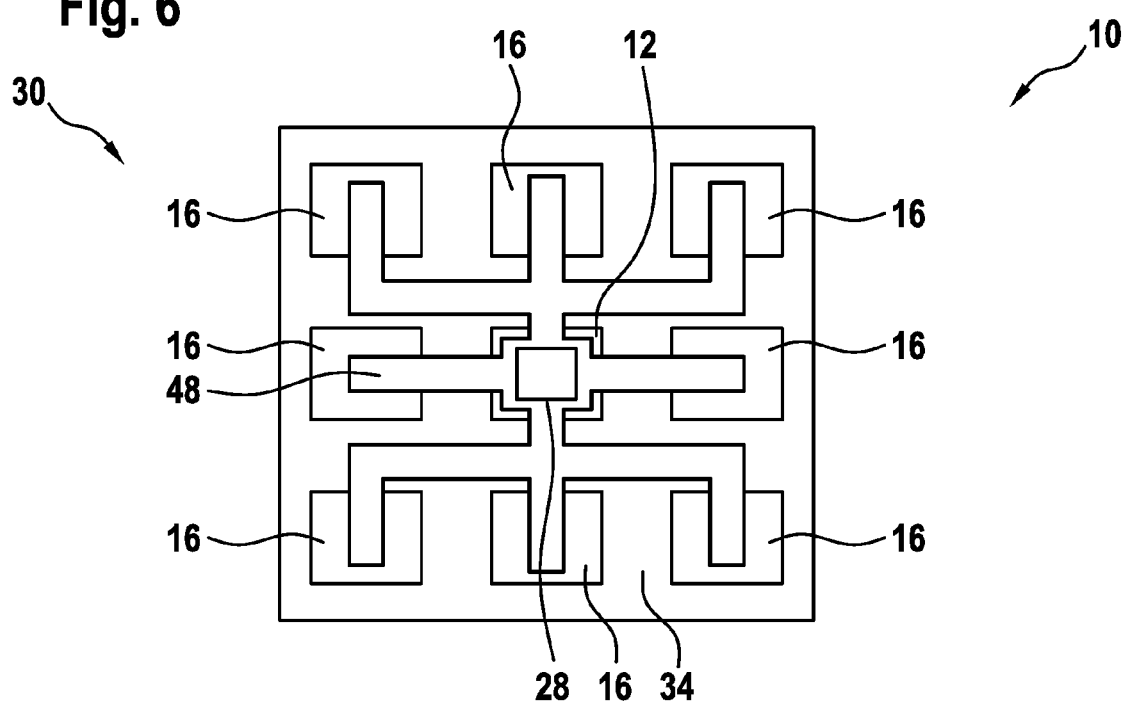
FIG. 6 shows a schematic top view of the power semiconductor device according to a further embodiment of the invention.

FIGS. 4 to 6 show embodiments of semiconductor modules 30 that may be used with respect to the embodiment of the power semiconductor device 10 of FIG. 1.

FIG. 4 schematically shows a cross-section through a power semiconductor device 10 based on one power semiconductor module 30, which comprises a baseplate 34, a top plate 36 and the Si chip 12 as well as the wide bandgap material chip 16 sandwiched between them in a press-pack arrangement. The baseplate 12 may be an electrically conducting plate, for example made of Mo. Also, the top plate 36 may be an electrically conducting plate, for example made of Cu or Al.

Both chips 12, 16 may comprise a bottom electrode 38, 38' and a top electrode 40, 40'. The terms "bottom" and "top" are used here to distinguish the two opposite lying electrodes, and not meant as an absolute position of the electrodes. Every electrode may be provided by a metal layer, which is much thinner than the thickness of the corresponding chip 12, 16. Both semiconductor chips 12, 16 may be attached to the baseplate 12 with the electrode 38, 38', for example by sintering, soldering or welding.

Directly on top of the Si chip 12 is a first metal preform 28 and directly on top of the wide bandgap material chip 16 is a second metal preform 28'. The first and second metal preforms 28, 28' may be made of the same material or of different materials. One or both first and/or second metal preforms 28, 28' may be attached to the respective chip 12, 16 (by sintering, soldering or welding) and/or may be pressed against the respective chip 12, 16 in particular the respective electrode 40, 40'.

A pressing force may be applied by an electrically conducting press pin 42, 42', which is pressed against the respective metal preform 28, 28'. For example, the press pin 42, 42' may comprise a spring element 44, 44', which, for example, may comprise a disc spring. The metal preforms 28, 28', the press pins 42, 42' and/or the spring elements 44, 44' may be accommodated between the baseplate 34 and the top plate 36.

The metal preforms 28, 28' may be in electrical contact with the top plate 36, for example via the press pins 42, 42' and/or via the spring elements 44, 44'. In such a way, the two chips 12, 16 are connected in parallel to each other. One of the metal preforms 28, 28' is in every current path.

The metal preform 28 is adapted for forming a conducting path through the Si chip 12, when heated as described above. The metal preform 28' is adapted for forming an at least temporary conducting path through the wide bandgap material chip 16, when heated, for example in the case of a failure. When a failure in the power semiconductor device 10 occurs, a current through the wide bandgap material chip 16 may form a temporary conducting path. Simultaneously or after that, a conducting path may be formed through the Si chip 12, which may provide a permanent short circuit failure mode for the semiconductor module 10. In such a way, a not so reliable short circuit failure mode for the wide bandgap material chip 16 may be supported by a more reliable short circuit failure mode provided by the Si chip 12.

The gate 20 of the Si chip 12 may be connected to different gate terminals 46, 46' as the gate 22 of the wide bandgap chip 16, such that the switches 14, 18 may be controlled independently from each other. Two independent gate signals may be provided to the switches 14, 18 for example from the same gate controller 24 or from two different gate controllers 24, 24'.

As indicated by the dotted line, the gate 20 of the Si chip 12 may be connected to the same gate terminal 46 as the gate 22 of the wide bandgap chip 16. In such a way, both switches 14, 18 may be controlled with the same gate signal, which may be provided by the same gate controller 24.

In the case a failure is detected, the controller(s) 24, 24' may actively trigger the Si chip 12 to its SCFM as described above and below.

FIG. 5 schematically shows a cross-section through a power semiconductor device 10 based on one power semiconductor module 30, in which the Si chip 12 is in a press-pack arrangement and the wide bandgap material chip 16 is in a clip arrangement. The chips 12, 16 and their gates 20, 22 may be connected as described with respect to FIG. 4.

A metal preform 28, which may be made of Al or Mo, is directly arranged on top of the Si chip 12. The metal preform 28 may be bonded (soldered, sintered or welded) to the Si chip 12. A metal clip 48, which may be mode of Cu, Al or Mo, is arranged on top of the Si chip 12 and on top of the wide bandgap material chip 16. The metal clip 48 may be bonded to the metal preform 28 and/or may be bonded to the wide bandgap material chip 16. With the metal clip 48, the switches 14, 18 are electrically interconnected. For example, an emitter of the Si chip 12 may be connected with a source of the chips 16. The metal clip 48 may be used to distribute current during normal operation, and it may couple a failure of the wide bandgap material chip 16 to the Si chip 12.

The metal clip 48 and the metal preform 28 are pressed against the Si chip 12 with a press pin 42, for example as described with respect to FIG. 4. The metal clip may provide a good thermal coupling between the wide bandgap material chip 16 and the Si chip 12. This may support forming a permanent conducting path in the Si chip 12, when the wide bandgap material chip heats due to a failure.

FIG. 6 shows an embodiment according to FIG. 5, with one Si chip 12 electrically interconnected with more than one wide bandgap material chip 16. The chips 12, 16 are electrically connected on their topside with one or more metal clips 48, which are positioned above a metal preform 28 on the Si chip 12. A metal clip 48 may allow a high current density in order to distribute current from the Si chip 12 to several wide bandgap material chips 16.

Figure 7:
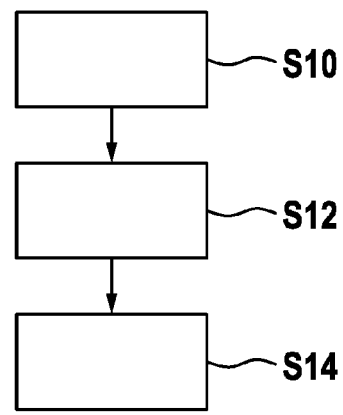
FIG. 7 shows a flow diagram for a method for controlling a power semiconductor module according to a further embodiment of the invention.

FIG. 7 shows a flow diagram for a method for controlling a power semiconductor device 10 as shown in FIGS. 1 to 6. The method may be performed automatically by the one or more gate controllers 24, 24'.

In step S10, the power semiconductor device is operated in a normal operation mode. The wide bandgap material switch 18 may be controlled for switching a current through the power semiconductor device 10 by applying corresponding gate signals to at least the wide bandgap material switch 18. Also, the Si switch 14 may be controlled to be switched accordingly to the wide bandgap material switch 18.

In the case, the gates 20, 22 are electrically interconnected, both switches 14, 18 may be switched simultaneously. The Si switch 14 may contribute to switching of a load current through the power semiconductor device 10.

It also may be that the Si switch 14 is only a victim switch, which is only used for providing a SCFM for the power semiconductor module 10. In this case, the Si switch may not be switched at all during the normal operation mode and/or may stay in a blocking state during normal operation mode.

During performance of the normal operation, a failure may take place. For example, the wide bandgap material switch 18 may become blocking. In general, the power semiconductor device 10 may be stacked with equally designed semiconductor devices 10 to form a high voltage switch, for example for AC-to-DC conversion in high voltage applications. In this case, an arc may be generated due to a high voltage applied to the power semiconductor device 10, since the other power semiconductor devices may be conducting.

It also may be possible that the wide bandgap material switch 18 starts to heat due to an internal developed resistance and/or that a gate unit of the wide bandgap material switch 18 (which may be a part of the controller 24, 24') has a failure.

In the case of a failure, a conducting path through the wide bandgap material chip 16 may start to form, for example based on a metal preform 28' as described above. However, this path may be formed only temporary and/or not as reliable as the conducting path that will be formed in step S14.

Also, in the case of a failure, a conducting path through the Si chip 12 may start to form passively, for example due to an overcurrent caused by a blocking switch 18.

In step S12, the measurement unit 26 senses the failure in the power semiconductor device 10. The failure may be detected by measuring a voltage across the power semiconductor device by light detection inside a power semiconductor module 30, 30' and/or by arc voltage detection inside a power semiconductor module 30, 30' accommodating the wide bandgap material chip 16.

In step S14, in the case of a sensed failure, a gate signal is applied to the Si switch 14, such that a current is generated in the Si chip 12 heating the Si chip 12 to a temperature, which is adapted for forming a permanent conducting path through the Si chip 12. For example, the gate signal applied to the Si switch 14 may have a lower voltage than in the normal operation mode, such that an internal resistance of the Si chip 12 is higher than in the normal operation mode. A load current through the Si chip 12 then may heat the Si chip 12 and, for example, the metal preform 28 and the Si chip 12 may form the conducting path.

It may be that the conducting path already has started to form and that the active switching of the Si switch 14 supports the formation.

The gate signal for the Si switch 14 may be generated independent from the gate signal for the wide bandgap switch 18, for example with a controller 24 different from a controller 24' as shown in FIGS. 2 and 3 or with one controller 24 adapted for generating two different gate signals, as, for example, shown in FIG. 1. It may be that after sensing the failure, only the Si switch 14 is provided with a gate signal.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS

10 power semiconductor device
12 Si chip
14 Si switch
16 wide bandgap material chip
18 wide bandgap material switch
20, 22 gate
24 gate controller
26 measurement unit
28 metal preform
30, 30' power semiconductor module
32, 32' housing
34 baseplate
36 top plate
38, 38' bottom electrode
40, 40' top electrode
42, 42' press pin
44, 44' spring element
46, 46' gate terminal
48 metal clip

The invention claimed is:

1. A method for controlling a power semiconductor device with a Si chip providing a Si switch and with a wide bandgap material chip providing a wide bandgap material switch, wherein the Si switch and the wide bandgap material switch are electrically connected in parallel, the method comprising:
   during a normal operation mode, controlling at least the wide bandgap material switch for switching a current through the power semiconductor device by applying corresponding gate signals to at least the wide bandgap material switch;
   sensing a failure in the power semiconductor device; and
   in the case of a sensed failure, controlling the Si switch by applying a gate signal to the Si chip, such that a current is generated in the Si chip heating the Si chip to a temperature forming a permanent conducting path through the Si chip, wherein the gate signal applied to the Si switch has a lower voltage than in the normal operation mode, such that an internal resistance of the Si chip is higher than in the normal operation mode.

2. The method of claim 1, wherein a gate signal for the Si switch and a gate signal for the wide bandgap material switch are generatable independently from each other, such that after sensing the failure, only the Si switch is provided with a gate signal.

3. The method of claim 1, wherein during the normal operation mode, the Si switch is controlled to be switched accordingly to the wide bandgap material switch.

4. The method of claim 1, wherein the failure is sensed by measuring a voltage across the power semiconductor device, which voltage in the case of a failure is higher than a nominal voltage, when the power semiconductor device is switched into a conducting state.

5. The method of claim 1, wherein the failure is sensed by at least one of light detection inside a power semiconductor module accommodating the wide bandgap material chip and arc voltage detection inside a power semiconductor module accommodating the wide bandgap material chip.

6. The method of claim 1, wherein the Si chip is attached to a metal preform adapted for forming a conducting path through the Si chip, when heated above a specific temperature by a current through the Si chip.

7. The method of claim 1,
   wherein the power semiconductor device is adapted for forming an at least temporary conducting path through the wide bandgap material chip, when heated by an overcurrent; and
   wherein the wide bandgap material chip is attached to a metal preform adapted for forming the conducting path.

8. The method of claim 1,
   wherein the Si switch is a thyristor, a transistor or a bi-mode type switch with an internal reverse conducting diode; and wherein at least one of the wide bandgap material is SiC and the wide bandgap material switch is a transistor.

9. A method for controlling a power semiconductor device, the method comprising:
operating the power semiconductor device in a normal operation mode where a wide bandgap material switch is selectively switched between a conducting state and a non-conducting state;
sensing a failure in the power semiconductor device; and
in response to sensing the failure, causing current to pass through a Si switch that is coupled in parallel with the wide bandgap material switch, the current causing the Si switch to be heated to a temperature high enough to form a permanent conducting path through the Si switch, wherein the current is caused to pass through the Si switch by applying a gate signal applied to the Si switch has a lower voltage than a gate signal applied in the normal operation mode thereby causing an internal resistance of the Si chip to be higher than in the normal operation mode.

10. The method of claim 9, wherein the Si switch and the wide bandgap material switch receive independent gate signals and wherein only the Si switch is provided with a gate signal after sensing the failure.

11. The method of claim 9, wherein operating in the normal operation mode comprises controlling the Si switch to be switched accordingly to the wide bandgap material switch.

12. The method of claim 9, wherein sensing the failure comprises measuring a voltage across the power semiconductor device and determining that the measured voltage is higher than a nominal voltage when the power semiconductor device is switched into the conducting state.

13. The method of claim 9, wherein sensing the failure comprises detecting light detection inside a power semiconductor module accommodating the wide bandgap material chip.

14. The method of claim 9, wherein sensing the failure comprises detecting an arc voltage inside a power semiconductor module accommodating the wide bandgap material chip.

15. The method of claim 9, wherein the Si chip is attached to a metal preform adapted that forms part of the permanent conducting path through the Si chip when heated above a specific temperature by a current through the Si chip.

16. The method of claim 15, wherein the permanent conducting path is formed by an eutectic alloy between the Si chip and the metal preform.

17. The method of claim 9,
wherein the power semiconductor device is adapted for forming a temporary conducting path through the wide bandgap material chip when heated by an overcurrent; and
wherein the wide bandgap material chip is attached to a metal preform adapted for forming the temporary conducting path.

18. The method of claim 9, wherein the Si switch is a thyristor, a transistor or a bi-mode type switch with an internal reverse conducting diode; and
wherein the wide bandgap material is SiC and the wide bandgap material switch is a transistor.

19. The method of claim 9, wherein the power semiconductor device is coupled in series a plurality of other power semiconductor devices, the permanent conducting path being coupled in series with the other power semiconductor devices after being formed.

20. A method for controlling a power semiconductor device, the method comprising:
operating the power semiconductor device in a normal operation mode where gate signals are applied to a Si switch and a wide bandgap material switch to selectively switch the Si switch and the wide bandgap material between a conducting state and a non-conducting state;
sensing a failure in the power semiconductor device; and
in response to sensing the failure, applying a gate signal to the wide bandgap material to attempt to switch the wide bandgap material to the non-conducting state and applying a gate signal, which is lower than the gate signal applied during the normal operating mode, to the Si switch to heat the Si switch to a temperature high enough to form an eutectic alloy between the Si switch and a metal preform in contact with the Si switch thereby forming a conducting path through the Si switch.

* * * * *